United States Patent
Zhang et al.

(10) Patent No.: US 7,542,260 B2
(45) Date of Patent: Jun. 2, 2009

(54) MOTHERBOARD

(75) Inventors: Xiang Zhang, Shenzhen (CN); Kun-Peng Li, Shenzhen (CN); Jia-Chang Zhu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 65 days.

(21) Appl. No.: 11/748,505

(22) Filed: May 15, 2007

(65) Prior Publication Data

US 2008/0135281 A1 Jun. 12, 2008

(30) Foreign Application Priority Data

Dec. 6, 2006 (CN) .................... 2006 2 0016218 U

(51) Int. Cl.
*H02H 5/04* (2006.01)
*H02H 1/00* (2006.01)

(52) U.S. Cl. ..................................................... 361/104

(58) Field of Classification Search .................. 631/104
See application file for complete search history.

(56) References Cited

U.S. PATENT DOCUMENTS

| 6,043,966 | A  | * | 3/2000 | Krueger et al. ............... 361/104 |
| 7,186,922 | B2 |   | 3/2007 | Kuzmenka |
| 2004/0190269 | A1 | * | 9/2004 | Makaran ...................... 361/748 |
| 2008/0100411 | A1 | * | 5/2008 | Tofigh et al. ................. 337/163 |

* cited by examiner

*Primary Examiner*—Ronald W Leja
(74) *Attorney, Agent, or Firm*—Frank R. Niranjan

(57) ABSTRACT

A motherboard includes a printed circuit board (10), and at least a power/ground trace (20) formed on the printed circuit board. The trace includes a pair of main lines (14, 24) and at least a protection line (12, 22) connected between the main lines. A width of the main lines is constant and wider than of the protection line. Wherein when a current flowing through the power/ground trace exceeds a maximum current the protection line can endure, the protection line is burnt and disconnected from the main lines, thereby generating less smoke and protecting components connected with the trace of the motherboard from damage due to excess current.

4 Claims, 2 Drawing Sheets

MOTHERBOARD

BACKGROUND OF THE INVENTION

1. Field of the Invention

The present invention relates to motherboards, and more particularly to a motherboard with special traces formed thereon.

2. Description of Related Art

In order to facilitate connections of integrated circuits on a motherboard, copper traces are etched and formed on or in a Printed Circuit Board (PCB) of the motherboard. For a given multi layer PCB having a dielectric constant, metal traces each with a constant width, and a given thickness, the characteristic impedance of a trace is directly proportional to a length of the trace, and it is inversely proportional to a width of the trace. A trace with larger cross-section often endures higher current flowing therethrough. However, the width and thickness of the trace is limited in order not to influence other traces of the PCB.

There are signal traces as well as power/ground traces in or on the PCB of the motherboard. An impedance mismatch of the signal traces can detrimentally distort signals traveling via the signal traces. Thus, impedance matching of the signal traces is critical. However, regarding the power/ground traces of the motherboard, designers consider the maximum current power/ground traces can endure, since high current often flows through the power/ground traces. If current flowing through the power/ground traces exceeds a maximum safe current, the power/ground traces may burn and generate smoke, causing damage to the motherboard and detrimentally affecting the environment. Thus, computers that generate less smoke should their traces burn are preferred.

What is needed, therefore, is a motherboard with special traces for decreasing smoke generated by the traces if they should burn and protecting components connected to the traces of the motherboard from damage due to excess current.

SUMMARY OF THE INVENTION

A motherboard includes a printed circuit board, and at least a power/ground trace formed on the printed circuit board. The trace includes a pair of main lines and at least a protection line connected between the main lines. A width of the main lines is constant and wider than the protection line. Wherein when a current flowing through the power/ground trace exceeds a maximum current the protection line can endure, the protection line is burnt and disconnected from the main lines, thereby protecting the main lines, generating less smoke, and protecting components of the motherboard from damage due to excessive current.

Other advantages and novel features will be drawn from the following detailed description of preferred embodiments with attached drawings, in which:

DETAILED DESCRIPTION OF THE INVENTION

Figure 1:
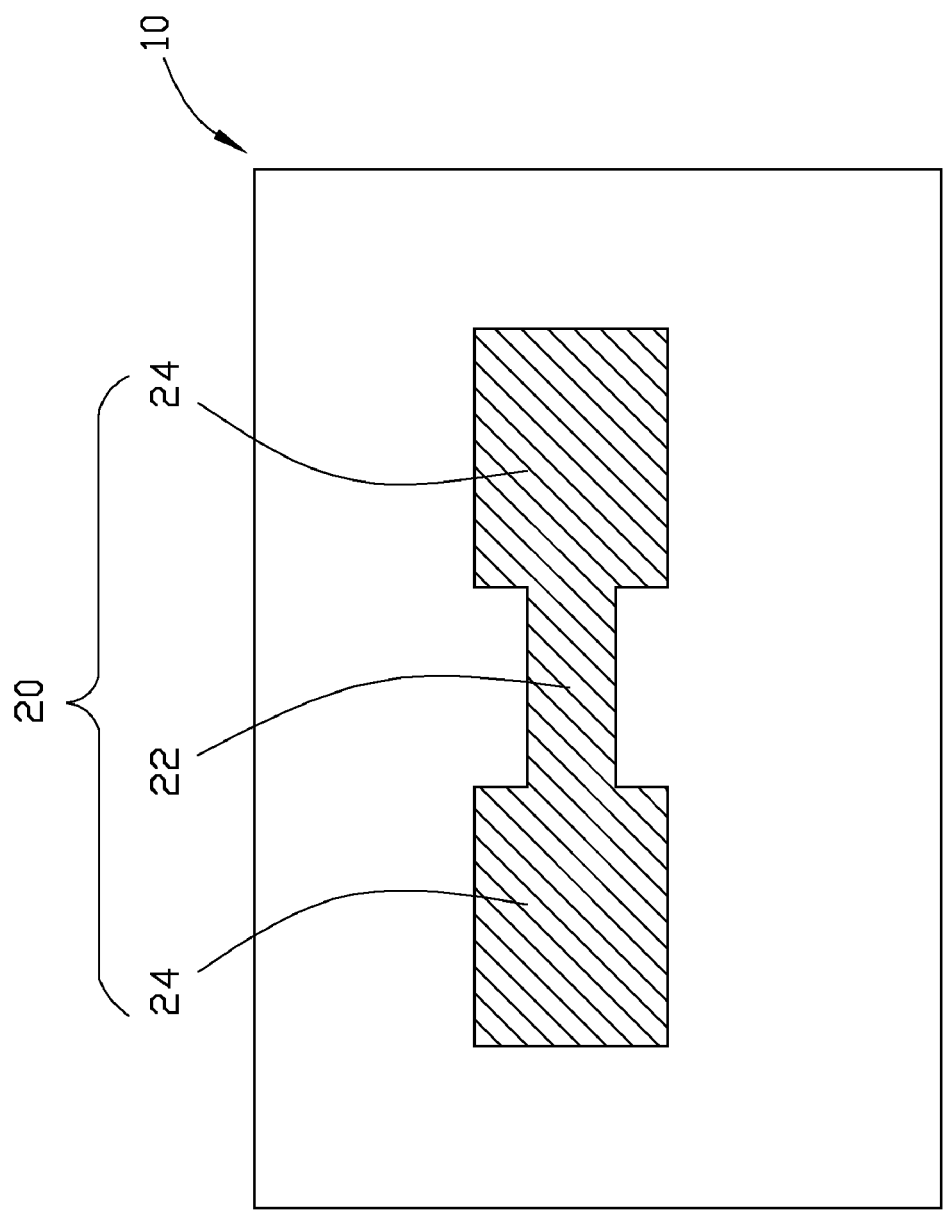
FIG. 1 illustrates a motherboard with a trace formed thereon in accordance with a first preferred embodiment of the present invention.

Referring to FIG. 1, a motherboard of a first preferred embodiment of the present invention includes a printed circuit board 10, and a shaded area depicting a copper trace 20. The trace 20 includes a pair of main lines 24 of uniform width, and a narrower and shorter protection line 22 connected therebetween. The protection line 22 has a pair of concave outside edge relative to the main lines 24. A width of the protection line 22 is less than that of the main lines 24, and a thickness of the trace 20 is uniform. Thus, a cross-section of the protection line is smaller than that of the main lines 24, and the protection line 22 fails at a lower maximum current flowing therethrough than the main lines 24.

Figure 2:
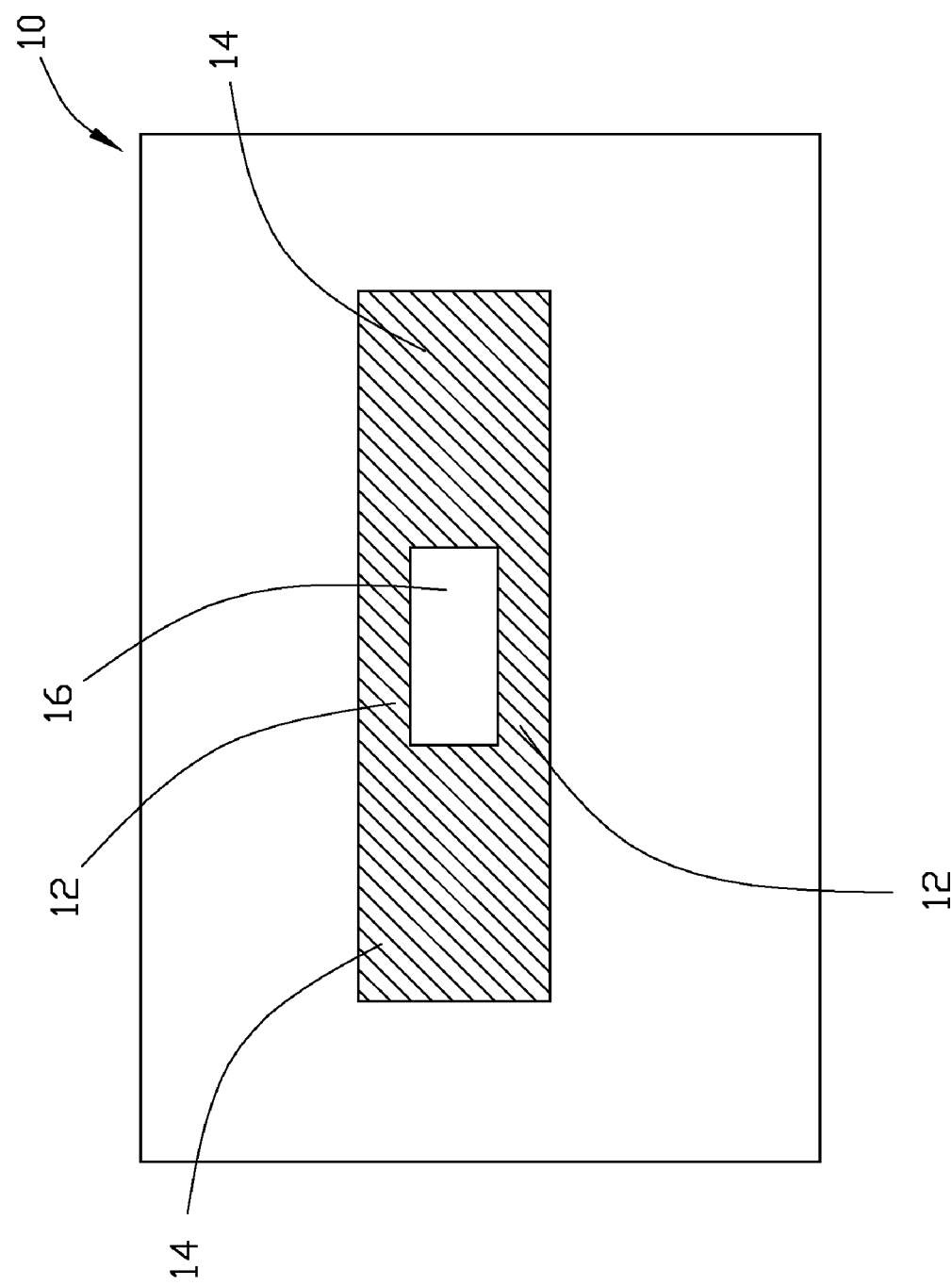
FIG. 2 illustrates the motherboard with another trace formed thereon in accordance with a second preferred embodiment of the present invention.

Referring to FIG. 2, the printed circuit board 10 of the motherboard in accordance with a second embodiment includes another copper trace with a different shape. The copper trace of FIG. 2 includes a pair of main lines 14 of uniform width, and a pair of narrower and shorter protection lines 12 connected between the main lines 14. Each protection line 12 has an outside edge flatly connected with an outside edge of the main lines 14. A space 16 without copper covered thereon is defined between the protection lines 12. A sum of widths of the protection lines 12 is less than the uniform width of the main lines 14, i.e., the effective cross-section of the protection lines 12 is smaller than that of the main lines 14. Thus, each of the protection lines 12 fails at a lower maximum current flowing therethrough than the main lines 14.

When current flowing through the copper traces of the printed circuit board 10 exceeds a maximum current the protection lines 12, 22 can endure, the protection lines 12, 22 will burn open disconnecting the main lines 14, 24 from each other, thus protecting the main lines 14, 24 from damage. The burnt protection lines 12 or 22 generate less smoke since they are relatively narrower than the main lines 14 or 24 and thus consist of less material. Integrated circuits or components of the motherboard 10 connected to the copper traces are also protected from damage due to excess current.

In the first and second embodiments, the copper trace may be a power trace with one end connected to a power supply for the motherboard, and another end connected to integrated circuits, or a ground trace with one end connected to a ground terminal of the motherboard, and another end connected to integrated circuits.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A motherboard comprising:
    a printed circuit board having a plurality of components mounted thereon; and
    a conductive trace formed on the printed circuit board to connect the components, the trace comprising a pair of main lines of uniform width and a pair of protection lines connected between the main lines, an effective cross-section of the main lines being larger than that of the protection line such that a maximum current the protection line can endure is lower than that of the main lines;

wherein when a current flowing through the trace exceeds the maximum current the protection lines of the trace can endure, the protection lines burn to open the connection between the main lines, thereby protecting the components of the motherboard from damage due to excessive current;

wherein side edges of the trace are flat and parallel each other, a space is defined in the trace, the protection lines are symmetrical to each other and separated from each other by the space.

2. The motherboard as described in claim 1, wherein a thickness of the main lines and the protection line is uniform, and the uniform width of the main lines is greater than that of the protection line.

3. The motherboard as described in claim 1, wherein the trace is a power or ground trace with one end connected to a power supply or ground, and another end connected to an integrated circuit of the motherboard.

4. The motherboard as described in claim 1, wherein the protection lines are shorter than the main lines.

* * * * *